United States Patent [19]
Ludikhuize

[11] Patent Number: 5,347,155
[45] Date of Patent: Sep. 13, 1994

[54] SEMICONDUCTOR DEVICE HAVING A LATERAL DMOST WITH BREAKDOWN VOLTAGE RAISING ZONES AND PROVISIONS FOR EXCHANGING CHARGE WITH THE BACK GATE REGION

[75] Inventor: Adrianus W. Ludikhuize, Eindhoven, Netherlands

[73] Assignee: U.S. Philips Corporation, New York, N.Y.

[21] Appl. No.: 65,084

[22] Filed: May 20, 1993

[30] Foreign Application Priority Data

May 21, 1992 [EP] European Pat. Off. ......... 92201456.8

[51] Int. Cl.$^5$ .................... H01L 29/06; H01L 29/72; H01L 29/76; H01L 29/78
[52] U.S. Cl. .................... 257/492; 257/491; 257/489; 257/493
[58] Field of Search ............... 257/489, 491, 492, 493, 257/497, 498, 495

[56] References Cited

U.S. PATENT DOCUMENTS

| | | | |
|---|---|---|---|
| 4,300,150 | 11/1981 | Colak | 257/495 |
| 4,422,089 | 12/1983 | Vaes et al. | 257/492 |
| 4,943,835 | 7/1990 | Yakushiji et al. | 257/495 |
| 5,034,790 | 7/1991 | Mukherjee | 357/23.8 |

FOREIGN PATENT DOCUMENTS

| | | | |
|---|---|---|---|
| 0201945 | 11/1986 | European Pat. Off. | H01L 29/08 |
| 2173037 | 3/1985 | United Kingdom | 257/495 |

OTHER PUBLICATIONS

"A Versatile 700–1200–V IC Process For Analog and Switching Applications", by Adriaan W. Ludikhuize, IEEE Transactions on Electron Devices, vol. 38, No. 7, Jul. 1991, pp. 1582–1589.

*Primary Examiner*—William L. Sikes
*Assistant Examiner*—Fetsum Abraham
*Attorney, Agent, or Firm*—Steven R. Biren

[57] ABSTRACT

A semiconductor device of the RESURF type with a lateral DMOST (LDMOST), comprising a semiconductor body (1) of substantially a first conductivity type and a surface region (3) of a second conductivity type adjoining the surface (2). The LDMOST comprises a back gate region (5) of the first conductivity type provided in the surface region (3), with a source region (6) of the second conductivity type in the back gate region (5) and a channel region (7) defined between the source region (6) and an edge of the back gate region (5). A drain region (8) of the second conductivity type is at a distance from the back gate region (5). A number of breakdown voltage raising zones (9) of the first conductivity type are provided between the back gate region (5) and the drain region (8). According to the invention, at least one zone of the back gate region (5) forming zone and of the first breakdown voltage raising zone (9A), which is closest to the back gate region (5), is provided with at least one portion (35, 36) projecting towards the other zone, at the area of which portion the distance between this zone and the other zone is smaller than in an adjoining portion of this zone. The exchange of charge between the back gate region (5) and the first breakdown voltage raising zone (9A) can take place through this projecting portion (35, 36), so that the semiconductor device can be switched more quickly.

14 Claims, 6 Drawing Sheets

SEMICONDUCTOR DEVICE HAVING A LATERAL DMOST WITH BREAKDOWN VOLTAGE RAISING ZONES AND PROVISIONS FOR EXCHANGING CHARGE WITH THE BACK GATE REGION

BACKGROUND OF THE INVENTION

The invention relates to a semiconductor device of the RESURF type with a lateral DMOST (LDMOST), comprising a semiconductor body of substantially a first conductivity type and a surface zone which adjoins a surface, which is of a second conductivity type opposed to the first, and which forms a pn junction with the semiconductor body at the side remote from the surface, which LDMOST comprises a back gate region in the form of a surface zone of the first conductivity type provided in the surface region with a source region in the form of a surface zone of the second conductivity type in the back gate region and a channel region defined between the source region and an edge of the back gate region, and a drain region in the form of a surface zone of the second conductivity type which is at a distance from the back gate region, while a number of breakdown voltage raising zones of the first conductivity type are provided so as to adjoin the surface between the back gate and the drain region.

A device of the kind mentioned in the opening paragraph is known from the article "A Versatile 700-1200-V IC Process for Analog and Switching Applications" in "IEEE Trans. on Electron Devices, vol. 38, no. 7, July 1991, pp. 1582–1589", which is particularly suitable as a switching element for high voltages. In the known device, an n-channel LDMOST lies in the surface region. The surface region is formed by an n-type epitaxial layer on a semiconductor body formed by a p-type semiconductor substrate, where the surface region is laterally bounded by a p-type separation region which extends from the surface down to the substrate. A p-type back gate and n-type source and drain regions are provided in the surface region. Gate oxide is locally present on the surface above the back gate. Electric conductors are provided, forming a source/back gate connection and a gate electrode, above the source region, the back gate region and the gate oxide. The source and back gate regions are short-circuited. In addition, the drain region is provided with an electric conductor as a drain connection. The so-called RESURF principle is used for rendering the semiconductor device suitable for high voltages, i.e. the net doping of the surface region in atoms per unit area is so low that, when a voltage is applied across the first pn junction, the surface region is at least locally depleted over its entire thickness before breakdown takes place. A target value for net doping in RESURF is approximately $1 \times 10^{12}$ atoms/cm$^2$. In the known semiconductor device, a number of breakdown voltage raising zones are provided between the back gate and the drain region. The breakdown voltage raising zones ensure that the surface region is not only depleted from the first pn junction between substrate and epitaxial layer, but also from pn junctions between the breakdown voltage raising zones and the epitaxial layer in the case of a high voltage at the drain connection. The epitaxial layer is thus depleted from several sides, so that even at a doping concentration of the surface region higher than approximately $1 \times 10^{12}$ atoms/cm$^2$, for example approximately $1.5 \times 10^{12}$ atoms/cm$^2$, the RESURF condition can be satisfied: the epitaxial layer can be entirely depleted at least locally before avalanche breakdown between substrate and back gate occurs. The breakdown voltage raising zones spread the electric field in the surface region during this, so that no high electric fields occur locally.

The channel region is situated at the surface below the gate oxide. Charge carders from the channel region must pass below the breakdown voltage raising zones through the so-called drift region to the drain. A breakdown voltage raising zone which lies too close to the back gate region blocks the charge carriers coming from the channel region. This is why a region between back gate and drain adjoining the surface and the back gate region is kept free from breakdown voltage raising zones in an LDMOST. When the voltage at the drain region increases in an n-channel LDMOST after switching off of the LDMOST, the breakdown voltage raising zones will follow the drain region as regards voltage until punch-through to the pn junction between back gate and surface region charges the breakdown voltage raising zones negatively and the zones are at least partly depleted. Now when the drain voltage drops after switching on of the LDMOST, the breakdown voltage raising zones cannot be discharged through the cut-off pn junctions and remain therefore negatively charged for some time, which is accompanied by a high on-resistance (resistance between drain and source) of the LDMOST, because a portion of the surface region between back gate and drain, the so-called drift region, remains partly depleted. This high on-resistance remains until holes are supplied from the pn junction between the back gate and the surface region, for example, through leakage or punch-through.

SUMMARY OF THE INVENTION

The invention has for its object inter alia to provide an LDMOST which exhibits no or substantially no increase in the on-resistance when switched on.

According to the invention, the device is for this purpose characterized in that at least one zone of the back gate region forming zone and of the first breakdown voltage raising zone, which lies closest to the back gate region, is provided with at least one portion projecting towards the other zone, at the area of which projecting portion the distance between this zone and the other zone is smaller than at an adjoining portion of this zone.

In the known semiconductor device, the first breakdown voltage raising zone is at a comparatively great distance from the back gate region so as not to block charge carriers coming from the channel region. According to the invention, the distance between the back gate region and the first breakdown voltage raising zone is reduced locally at projecting portions. Owing to the smaller distance, the charge can be more easily supplied or removed. When in this case, for example, the drain voltage drops after switching on of an n-channel LDMOST, the first breakdown voltage raising zone is provided with holes through its projecting portions, so that the potential of the first zone can rise quickly. Since the distance between the back gate region and the first breakdown voltage raising zone is greater outside the projecting portions than at the projecting portions, charge carriers can move from the channel region to the drain region, by passing the projecting portions. The other breakdown voltage raising zones may lie so close together that a comparatively easy charge transport from the first zone to further zones is possible, so that the potentials of these zones can quickly adjust themselves.

A first embodiment suitable for applications in which the breakdown voltage is of greater importance than the speed is characterized in that the projecting portion is separated from the other zone by an interposed portion of the surface region, the distance between the zones at the area of the projecting portion being so small that charge transport by means of punch-through is possible. The first zone is then not fixedly connected to the back gate region as regards its potential, but it can adjust itself to its own potential, so that the electric field can be better spread, while nevertheless charge can be easily exchanged with the first zone by means of punch-through. Preferably, the distance at the area of the projecting portion is smaller than 5 $\mu$m. Given such a distance, punch-through takes place at a voltage of less than 2 V.

In a second embodiment, in which an optimal speed can be achieved, the projecting portion is in connection with the other zone. The first breakdown voltage raising zone then no longer has a floating potential, at least most of the time, because the first zone has an electrical connection to the back gate region. The first breakdown voltage raising zone can then be quickly provided with charge through the electrical connection to the back gate region after switching on of the LDMOST.

The known semiconductor device usually has an elongate channel region with a width W which is greater than the length L of the channel region. W here denotes the channel dimension parallel to the surface and perpendicular to the current direction of the charge carriers in the channel, while L denotes the channel dimension parallel to the surface and parallel to the current direction of the charge carriers in the channel. In such a semiconductor device, the projecting portion is preferably situated near a narrow end of the channel region. The width of the channel is substantially not reduced in that the projecting portion is situated near the narrow end of the channel region. It is then in addition possible to choose the width of the projecting portion to be comparatively great, so that a satisfactory exchange of charge between back gate and the first breakdown voltage raising zone is obtained. Any unfavorable effects of the edge of the channel arising from an unfavorable geometry, whereby for example high electric fields occur locally owing to curvature of the pn junction between back gate and surface region, can also be suppressed by means of the projecting portion. The projecting portion then blocks the transport of charge carriers from the channel at the narrow end of the channel region.

When the channel has a very great width/length ratio W/L, the breakdown voltage raising zones often also have large dimensions in the width direction of the channel and small dimensions in the length direction of the channel. To change the potential of the breakdown voltage raising zone everywhere in the zone, the charge must be supplied in the width direction of the channel through the first zone. In this direction, however, the zone has a comparatively small cross-section and a great length, so that there is a comparatively high resistance in the zone. Owing to this resistance, a delay arises in the supply of charge carriers. Preferably, the projecting portion is situated at the area of a long side of the channel region and extends over a width which is small compared with the width of the channel of the LDMOST. Thus it is possible to transport charge comparatively easily towards the entire zone in that, for example, a projecting portion is provided in the center of the channel width. The width of the projecting portions is so chosen that the influence on charge carriers from the channel region is small. Preferably, the width over which the first breakdown voltage raising zone is locally prolonged amounts to less than 10% of the channel width. When the width over which the first breakdown voltage raising zone is prolonged amounts to less than 10% of the width of the channel, the channel is still sufficiently wide for charge carriers from the channel to pass practically unhampered along the breakdown voltage raising zones through the drift region to the drain.

Preferably, the projecting portions are present at locations which are at least substantially homogeneously distributed over the width of the channel region. In the case of an elongate or annular first breakdown voltage raising zone, a projecting portion will then be present periodically at given interspacings in the width direction of the channel. Each projecting portion then ensures the supply of charge carders to a portion of the first breakdown voltage raising zone of substantially equal dimensions. In this manner a quicker supply of charge to the entire breakdown voltage raising zone can be realized.

The potentials of further breakdown voltage raising zones are adjusted through charge transport from the first breakdown voltage raising zone. For this purpose, the zones have at least locally an interspacing which is so small that charge transport between the zones is possible, for example, by punch-through. Preferably, at least one of adjacent breakdown voltage raising zones is provided with at least one portion which projects towards the other zone, at the area of which portion the distance between this zone and the other zone is smaller than at an adjoining portion of this zone. The exchange of electric charge can then take place by punch-through over a small distance between a projecting portion and the other zone, or by conduction in the case of an overlap of the projecting portion with the other zone. The potentials of further zones are then determined through these projecting portions. The projecting portions afford a great design freedom. The zones may be laid at a comparatively great distance from one another, so that there is an additional degree of freedom for realizing a desired potential profile, or a desired electric field distribution. In an alternative embodiment, adjacent breakdown voltage raising zones overlap one another partly. Such an embodiment can be readily manufactured by having doping profiles of doping atoms overlap one another partly. The degree of overlap and the doping concentration then determine the electric resistance between the zones. The potentials of the zones are then adjusted by means of these resistances. The measures for improving charge transport between the further breakdown voltage raising zones may also be used for still further breakdown voltage raising zones situated, for example, between the drain region and a separation region which surrounds the surface region.

Preferably, the breakdown voltage raising zones have such a high concentration of doping atoms that the zones are not fully depleted when the surface region is depleted at least locally over its entire thickness upon the application of a voltage across the first pn junction. The projecting portions are then sufficiently low-ohmic, so that a good electrical connection between the first zone and the back gate region and between zone and zone can be achieved, while the potentials of the zones are well defined.

In practice, it has major advantages when the breakdown voltage raising zones have a concentration of doping atoms of more than $1.0 \times 10^{12}$, atoms/cm$^2$, for example, approximately $2 \times 10^{12}$ atoms/cm$^2$. Several types of high-voltage semiconductor devices can be manufactured with such a doping level. The manufacturing process of the semiconductor device is then much simpler.

An additional advantage is obtained when a dielectric layer, which is at least partly covered by a conducting field plate, is present on the surface between the back gate and the drain region. The dielectric layer may have different thickness levels. Such a field plate is electrically connected to the gate or source connection. The field plate and the dielectric layer may be used for depleting the surface region from the surface, so that at higher doping levels of the surface region nevertheless complete depletion of the surface region can be achieved before breakdown occurs in this region. During switching off of the LDMOST, when the drain voltage rises strongly, however, the field plate also forms a gate electrode of a parasitic MOST. The back gate region and the first breakdown voltage raising zone then act as drain and source regions. The parasitic MOST may be used for enhancing the measures according to the invention in that the removal of charge carders from the first breakdown voltage raising zones is improved. In fact, when the parasitic MOST is on, there is a conduction channel between back gate and first zone. Removal of charge carriers may take place through this channel.

Especially for low-side applications, when the drain region can be at a high voltage relative to the semiconductor body and the source region, the operation of the breakdown voltage raising zones at the surface according to the invention may yet be enhanced when a further breakdown voltage raising zone of the first conductivity type is provided below the back gate region at a boundary of the surface region and the semiconductor body, with a doping atom concentration which is higher than that of the semiconductor body. Owing to the higher doping level compared with that of the semiconductor body, this zone ensures that the surface region is depleted more strongly than would be possible from the first pn junction between semiconductor body and surface region alone. The surface region is thus strongly depleted from two sides owing to the cooperation of the breakdown voltage raising zones at the surface and the breakdown voltage raising zone below the back gate, so that electric fields in the drift region near the conduction channel become weaker and breakdown of the surface region will occur less quickly. In addition, holes are better drained off to the back gate region and the semiconductor body in the case of voltage changes at the drain region, for example, in an n-channel LDMOST.

BRIEF DESCRIPTION OF THE DRAWING

The invention will be explained in more detail below, by way of example, with reference to several embodiments and the accompanying diagrammatic drawing, in which.

The Figures are purely diagrammatic and not drawn to scale. Corresponding parts in the Figures are generally given the same reference numerals. Wiring patterns on the surface have been left out in the plan views of FIGS. 1, 3 and 5 for reasons of clarity.

DESCRIPTION OF THE PREFERRED EMBODIMENTS

Figure 1:
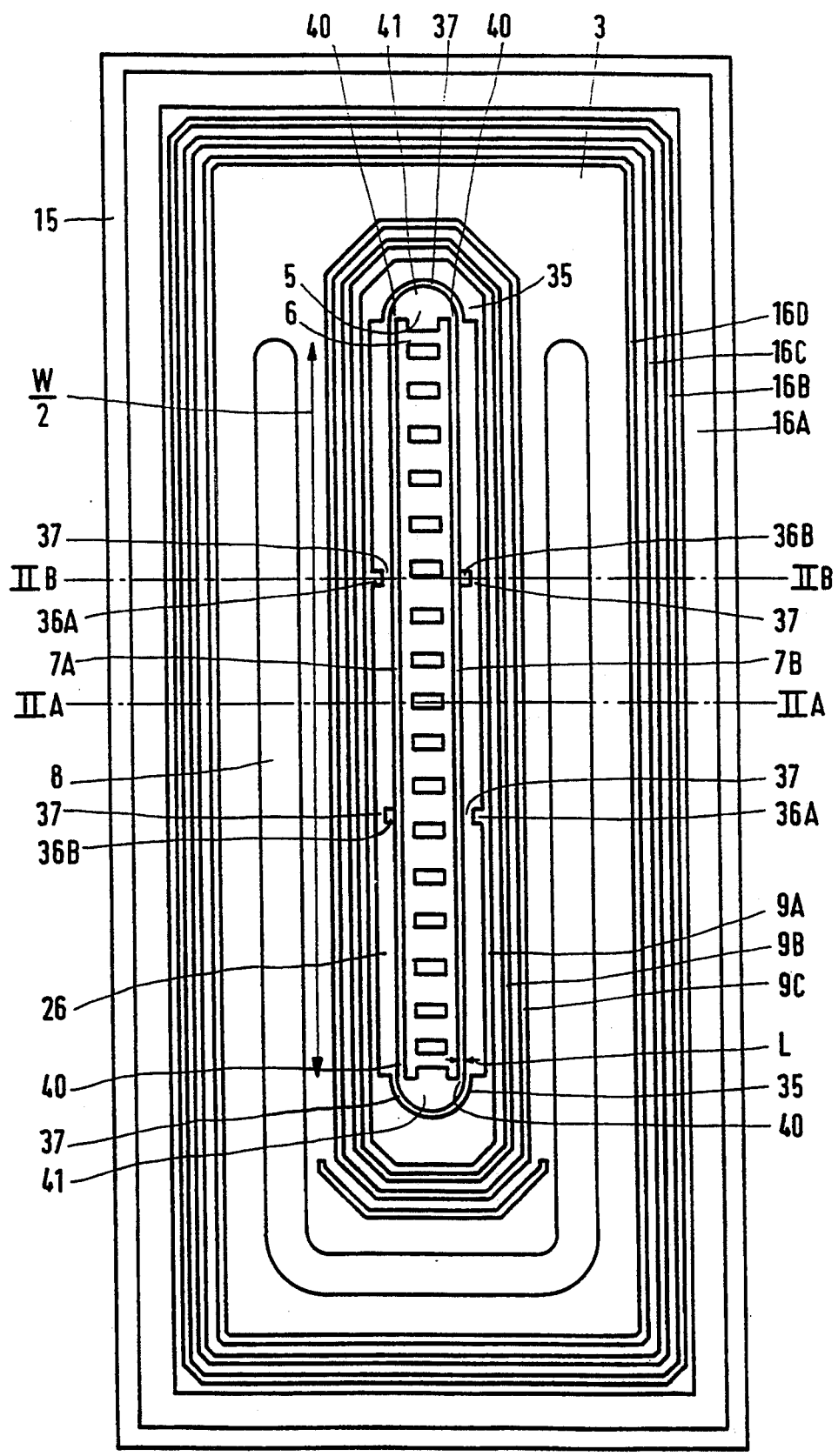
FIG. 1 is a plan view of a semiconductor device according to the invention.
Figure 2A:
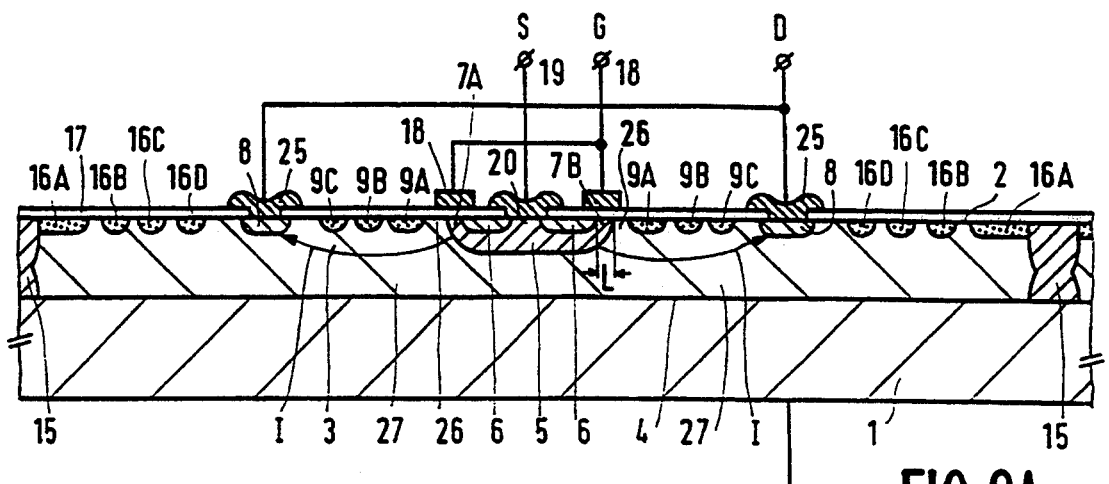
FIG. 2 is a cross-section taken on the line IIA—IIA (FIG. 2A) and a cross-section taken on the line II-B—IIB (FIG. 2B) of the semiconductor device of FIG. 1.
Figure 2B:
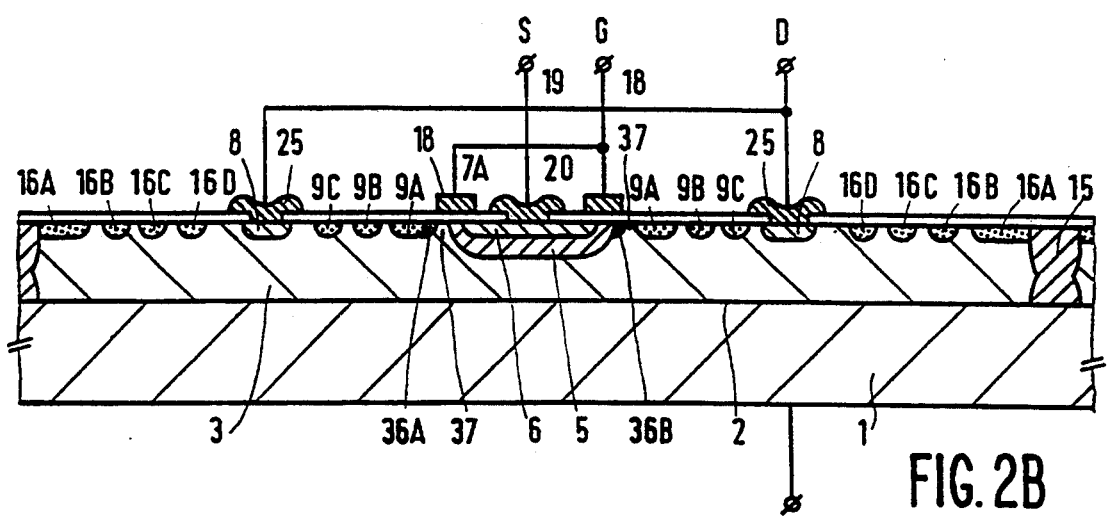

FIG. 1 is a plan view and FIG. 2 comprises two cross-sections, FIGS. 2A and 2B, taken on the lines IIA—IIA and IIB—IIB, respectively, of FIG. 1 of a semiconductor device according to the invention. The semiconductor device of the RESURF type with a lateral DMOST (LDMOST) comprises a semiconductor body 1 of substantially a first conductivity type and a surface region 2 of a second conductivity type opposite to the first, adjoining a surface 2. The side of the surface region 3 remote from the surface 2 forms a first pn junction 4 with the semiconductor body 1. The LDMOST comprises a back gate region 5 in the form of a surface zone of the first conductivity type provided in the surface region 3, with a source region 6 in the form of a surface zone of the second conductivity type in the back gate region 5. Furthermore, the LDMOST comprises a channel region 7 defined between the source region 6 and an edge of the back gate region 5 and a drain region 8 in the form of a surface zone of the second conductivity type which is at a distance from the back gate region 5. A number of breakdown voltage raising zones 9 of the first conductivity type are provided adjacent the surface 2 between the back gate region 5 and the drain region 8. The total net doping level of the second conductivity type per unit area of the surface region 3 is sufficiently low, at least in the area between the drain region 8 and the back gate region 5, for the surface region 3 to be depleted over its entire thickness at least locally before breakdown occurs when a voltage is applied across the first pn junction 4. When, as in the present example, the surface region 3 is also depleted from the breakdown voltage raising zones 9 and from a pn junction between back gate region 5 and surface region 3, the doping level of the surface region 3 may be taken higher than when depletion takes place from the first pn junction 4 only. The surface region 3 is laterally bounded by a separation region 15 of the first conductivity type which extends from the surface 2 down to the semiconductor body 1. Further breakdown voltage raising zones 16 of the first conductivity type are present at the surface 2 between drain region 8 and separation region 15, ensuring that the surface region 3 is depleted not only from the pn junction 4 between the semiconductor body 1 and the surface region 3 in the case of a high voltage at the drain region 8 relative to the semiconductor body 1, but also from pn junctions between the breakdown voltage raising zones 16 and the surface region 3. A dielectric layer, in this example silicon oxide 17, is present on the surface 2. The dielectric layer 17 forms the gate oxide above the channel region 7. An electric conductor 18 lies on the gate oxide as a gate electrode, in this example a highly doped polysilicon conductor. A contact window is provided in the oxide layer 17 above the source region 6 and the back gate region 5. An electric conductor 19 is provided in this contact window, in this example an aluminium conductor. The back gate and source regions 5 and 6 are so formed that the source region 6 is fully surrounded by the back gate region 5 (see FIGS. 2A, 2B), while locally within the source region 6, portions 20 of the back gate region 5 adjoin the surface 2 (see FIG. 2A). The contact window is partly above the source region 6 (see FIG. 2B) and above the portions 20 of the back gate region 5 (see FIG. 2A). The electric conductor 19 then short-circuits the back gate and the source. Such a geometry of back gate region 5 and source region 6 is very compact, while the short-circuiting is very effective. The drain region 8 is provided with an electric conductor 25 for connecting the drain of the LDMOST. The LDMOST pictured in FIG. 1 has a drain region 8 which substantially surrounds the back gate region 5, a channel 7A, 7B being formed symmetrically on either side of the back gate region 5. For an LDMOST, a region 26 between the back gate and drain regions, adjoining the surface 2 and the back gate region 5, must remain free from breakdown voltage raising zones 9, because charge carders from a conduction channel 7, which may be present at the surface 2 below the gate oxide 17, must be capable of running through the region 26 to the drain region 8.

An n-channel LDMOST is described as an example of a semiconductor device according to the invention. A p-type silicon substrate is used as the semiconductor body for this with a doping concentration of $1.5 \times 10^{14}$ atoms/cm$^3$ (resistivity approximately 90 Ω.cm). The surface region 3 comprises an n-type layer with a doping concentration of $7 \times 10^{14}$ atoms/cm$^3$ and a thickness of 25 μm (resistivity approximately 6 Ω.cm) provided epitaxially on the semiconductor body. The back gate region 5 has a p-type doping concentration of $1 \times 10^{14}$ atoms/cm$^2$ and the source region 6 and the drain 8 have an n-type doping of $9 \times 10^{15}$ atoms/cm$^2$. The breakdown voltage raising zones have a p-type doping of $2 \times 10^{12}$ atoms/cm$^2$. The separation region 10 has a p-type doping of $1 \times 10^{16}$ atoms/cm$^2$. The width W of the channel region 7 is approximately 1 mm. Because of the symmetry of the LDMOST of FIG. 1, this width W is composed of two portions of approximately 0.5 mm each. The back gate region 5 has the dimensions 0.5 mm×20 μm, and the drain region 8 is 1 mm×16 μm. The drain region is aim composed of two portions of approximately 0.5 mm length each for reasons of symmetry, with a connection between the two portions (see FIG. 1). The distance between back gate 5 and drain region 8 is approximately 70 μm. The first breakdown voltage raising zone 9A is more than 10 μm away from the back gate region 5, in this example 14 μm. With such a distance, the current I of electrons from the conduction channel 7 can be passed practically unhampered past the breakdown voltage raising zones 9 through the drift region 27 to the drain 8.

Such a semiconductor device is highly suitable as a high-voltage device, for example, in a video output amplifier. A quick response in combination with a low static dissipation is often desired in high-voltage semiconductor devices. This means that the LDMOST must be capable of quick switching, while the drift region must not have too high a resistance, i.e. the doping of the surface region 3 must not be too low.

In the known semiconductor device, problems may arise in switching of the LDMOST owing to the breakdown voltage raising zones 9 which are situated in an active portion of the LDMOST between back gate 5 and drain 8. When the drain-source voltage $V_{ds}$ between the drain region 8 and the source region 6 increases in an n-channel LDMOST after switching off of the LDMOST, the breakdown voltage raising zones 9 will follow the drain region 8 as regards voltage until the breakdown voltage raising zones 9 are negatively charged by punch-through of holes to the pn junction between back gate 5 and surface region 3, and the zones 9 will be depleted at least partly. After switching on of the LDMOST, the drain-source voltage $V_{ds}$ gets a low value. The charged breakdown voltage raising zones 9 are then at a negative voltage. The breakdown voltage raising zones 9 cannot be discharged through the blocked pn junctions and accordingly remain negatively charged for a time, which results in a high on-resistance (resistance between drain 8 and source 6) of the LDMOST, because a portion of the surface region 3 between back gate 5 and drain 8, the so-called drift region 27, remains depleted. This on-resistance remains until holes are supplied from the pn junction between the back gate 5 and the surface region 3 by means of leakage or punch-through. According to the invention, at least one zone of the back gate region forming zone 5 and of the first breakdown voltage raising zone 9A, which is closest to the the back gate region 5, is provided with at least one portion 35, 36 projecting towards the other zone at the area of which the distance between this zone and the other zone is smaller than at an adjoining portion of this zone.

Charge carriers in the MOST must be capable of moving from source 6 to drain 8 through the channel region 7 which extends immediately below the surface 2. To reach the drain 8 from the channel region 7, the charge carriers must pass through the drift region 27 below the breakdown voltage raising zones 9 (current I in FIG. 2A). To prevent the flow of charge carriers being blocked, therefore, the first breakdown voltage raising zone 9A in practice lies at a comparatively great distance away from the back gate region 5. According to the invention, the distance between the back gate region 5 and the first breakdown voltage raising zone 9A is rendered smaller locally at projecting portions 35, 36. Owing to the smaller distance, charge can be supplied or drained more easily. For example, when the drain-source voltage $V_{ds}$ drops after switching on of an n-channel LDMOST, the first breakdown voltage raising zone 9A is provided with holes through the projecting portion 35, 36, so that the potential of the first zone 9A can rise quickly. Since the distance between back gate region 5 and the first breakdown voltage raising zone 9A is greater outside the projecting portions 35, 36 than at the area of the projecting portions 35, 36, charge carriers can move from the channel region 7 to the drain region 8, by passing the projecting portions (see FIG. 2A, current I). The other breakdown voltage raising zones 9B, 9C may be so close together and so close to zone 9A that a comparatively easy charge transport from the first zone 9A to further zones 9B, 9C is possible, so that the potentials of these zones can adjust themselves.

FIG. 1 shows a first embodiment in which the projecting portion 35, 36 is separated from the other zone by an interposed portion 37 of the surface region 3, the distance between the zones 9A and 5 at the area of the projecting portion 35, 36 being so small that charge transport by punch-through is possible. The first breakdown voltage raising zone is then electrically not connected to the back gate region 5. The voltage difference between back gate 5 and first breakdown voltage raising zone 9A at which punch-through takes place may be determined through a suitable choice of the distance between back gate region 5 and the projecting portion 35, 36. The potential of the first zone 9A can adjust itself until this voltage difference has been reached. A suitable choice of this distance accordingly affords a designer of high-voltage devices an additional degree of freedom in his design. Preferably, the distance at the area of the projecting portion 35, 36 is smaller than 5 $\mu$m. With such a distance, punch-through takes place at a comparatively low voltage difference across back gate 5 and first zone 9A, for example, at a voltage difference of approximately 2 V for a distance of 5 $\mu$m. FIG. 1 shows two embodiments of the projecting portion 36. The projecting portion 36A is connected to the first zone 9A and extends towards the back gate region 5. The projecting portion 36B is connected to the back gate region 5 and extends towards the first zone 9A.

Figure 4:
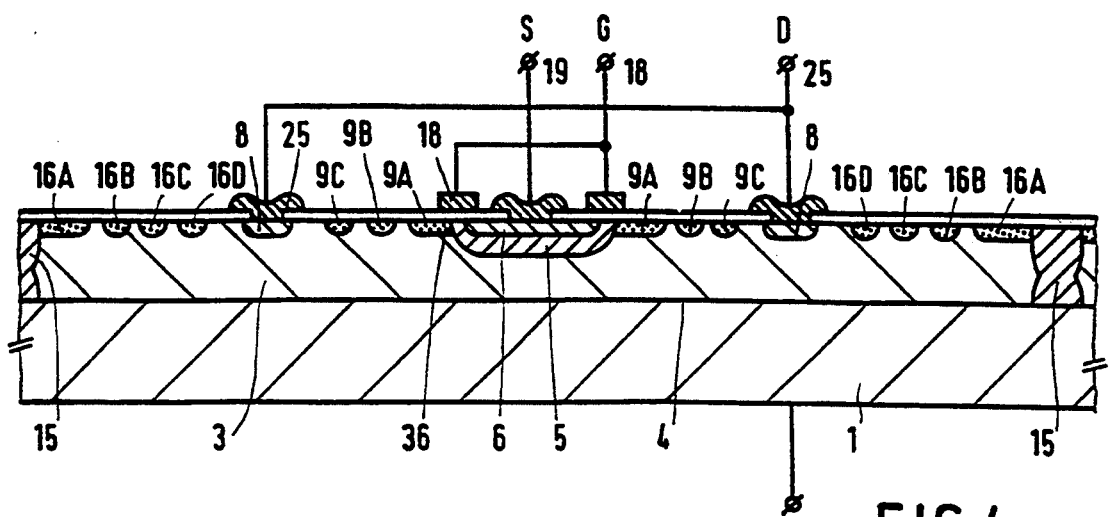
FIG. 4 is a cross-section taken on the line IV—IV of the semiconductor device of FIG. 3.
Figure 3:
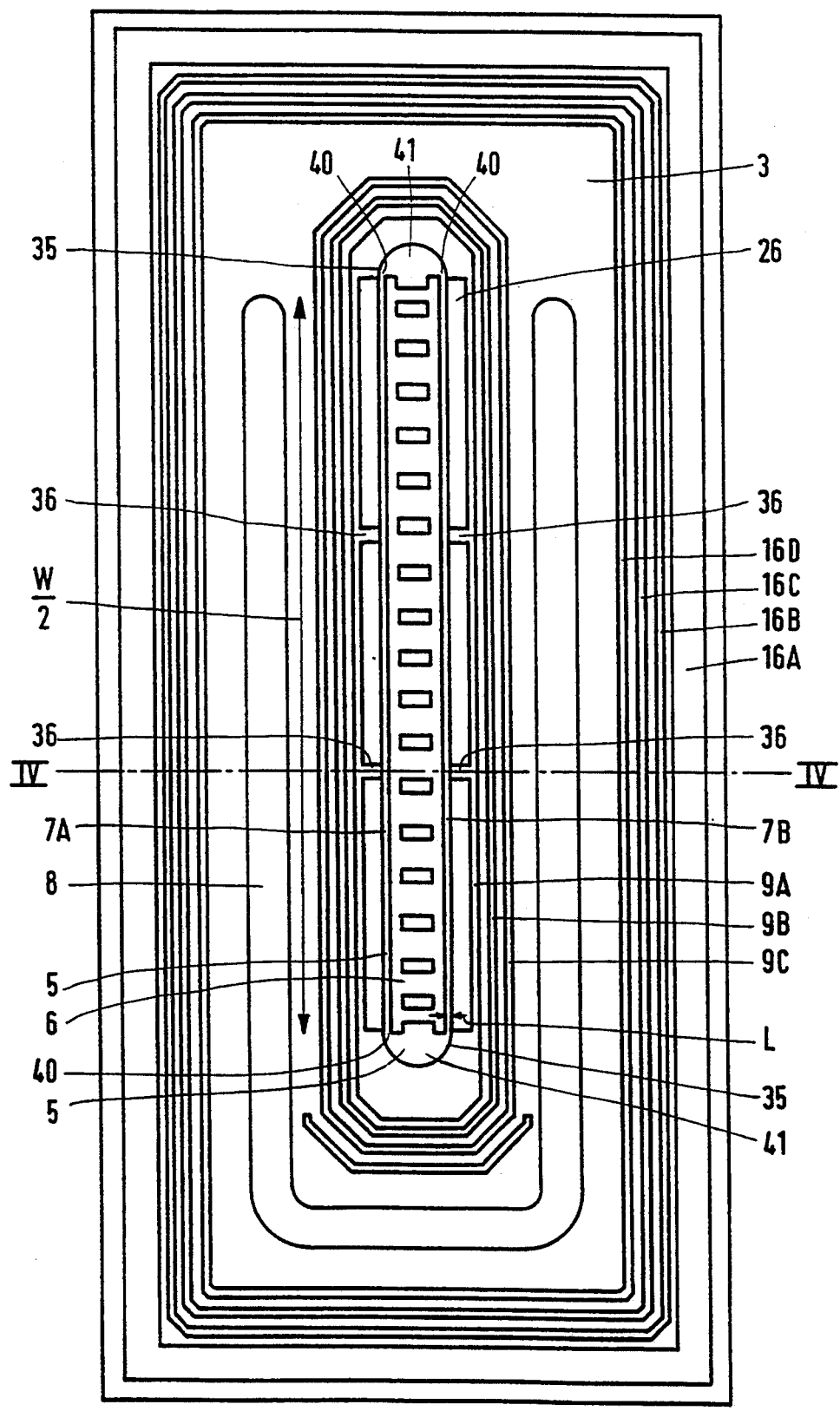
FIG. 3 is a plan view of a further embodiment of a semiconductor device according to the invention.

In a further embodiment shown in FIGS. 3 and 4, the projecting portion 35, 36 is in connection with the other zone. The first breakdown voltage raising zone 9A then no longer has a floating potential at least most of the time. The width, length, and doping atom concentration determine the resistance of the electrical connection between the back gate region 5 and the first zone 9A. The first breakdown voltage raising zone 9A may then be quickly provided with charge through the electrical connection 35, 36 to the back gate region 5, so that the potential of the first zone 9A can adjust itself quickly.

A high-voltage semiconductor device usually has an elongate channel region 7 with a width W which is greater than the length L of the channel region. In such a semiconductor device, the projecting portion 35 is preferably situated near a narrow end 40 of the channel region 7. The width W of the channel 7 is then substantially not reduced. It is in addition possible to choose the width of the projecting portion 35 to be comparatively great. By way of example, the entire narrow end portion 41 of the back gate region is used in the symmetrical construction of FIGS. 1 and 3 for forming the projecting portion 35, so that a good exchange of charge between back gate 5 and the first breakdown voltage raising zone 9A is possible. High electric fields may occur locally owing to curvature of the pn junction between back gate 5 and surface region 3 at the area of the narrow end 41 of the back gate region 5. Unfavorable effects such as local breakdown can be suppressed by means of the projecting portion 35. The projecting portion 35 then blocks the transport of charge carriers from the channel 7 at the narrow end 41 of the back gate region.

Given a great channel width (W) and a small channel length (L), the breakdown voltage raising zones 9 also have great dimensions in the direction of the width W of the channel and small dimensions in the longitudinal direction L of the channel 7, for example, the zone 9 is elongate or has the shape of a narrow ring (see FIGS. 1, 3). Now if the channel 7 has a very great width/length ratio W/L, charge must be transported in the width direction W of the channel 7 through the first zone 9A in order to change the potential of the zone 9A everywhere in this first zone 9A. The geometric dimensions of the first zone 9A, however, cause a comparatively high resistance in the zone 9A, so that a certain delay in the transport of charge carriers may occur. Preferably, the projecting portion 36 is situated at the area of a long side of the channel region 7 and extends over a width which is small compared with the width W of the channel 7 of the LDMOST. In a symmetrical construction as shown in FIGS. 1 and 3, for example, when a projecting portion 36 is present in the center of the half width W/2 of the channel halves 7A, 7B, charge may thus be transported to the entire zone 9A comparatively easily. It is also possible for projecting portions to be present, for example, at several locations 36A, 36B over the width W of the channel region 7, preferably in combination with projecting portions 36 at the narrow end 41 of the back gate region 5 (see FIGS. 1, 3). The width of the projecting portions 36 at the long side of the channel region 7 is so chosen that the influence on charge carriers coming from the channel region 7 is small. Preferably, the width over which the first breakdown voltage raising zone 9A is locally prolonged amounts to less than 10% of the width W of the channel 7. If the width over which the first breakdown voltage raising zone 9A is prolonged is less than 10% of the width of the channel 7, the channel is still sufficiently wide, so that the projecting portions 36 have substantially no influence on the possible size of the flow of charge carriers I from the channel 7. The width of the projecting portions 36, for example, is taken to be equal to the dimension of the first zone 9A in the length direction L of the channel region 7. If several projecting portions 36 are used, the projecting portions 36 are in locations 36A, 36B which are at least substantially homogeneously distributed over the width W of the channel region 7. With an elongate or annular first breakdown voltage raising zone as shown in FIGS. 1 and 3, a projecting portion 36 will then be present periodically with a certain interspacing in the width direction W of the channel. For great widths W, for example, a projecting portion 36 will be present every 300 $\mu$m in the width direction of the channel 7. Each projecting portion 36 then sees to the transport of charge carriers to or from a portion of the first breakdown voltage raising zone 9A which is of substantially the same dimensions. The charge carders do not have to move more than at most 150 $\mu$m to either side of the projecting portion. A quicker charge transport to or from the entire breakdown voltage raising zone 9A may be realized in this manner. In the known semiconductor device without projecting portions, it takes a period of the order of one second before the first zone 9A has been charged, whereas this is only approximately 100 ns in the semiconductor device according to the invention.

Figure 5:
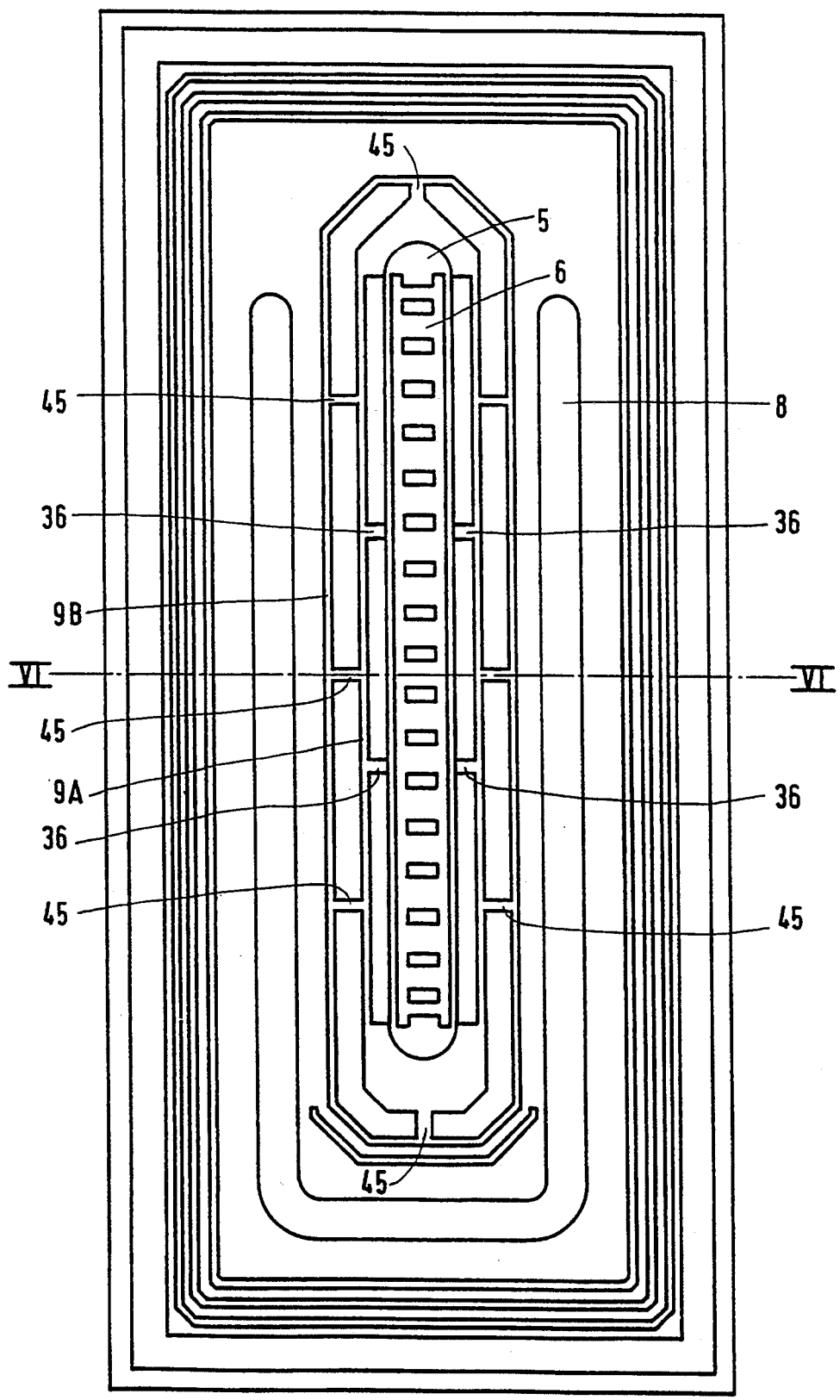
FIG. 5 is a plan view of a further embodiment of a semiconductor device according to the invention.
Figure 6:
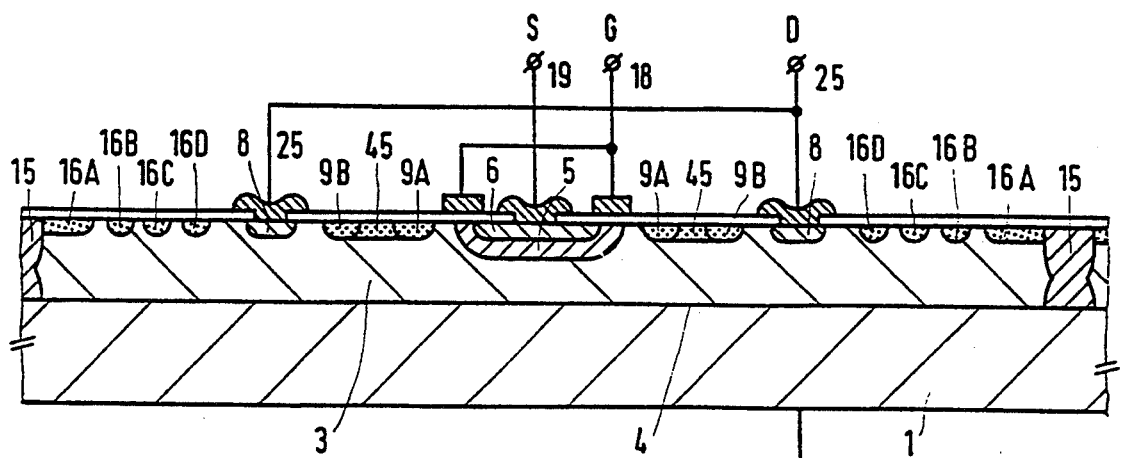
FIG. 6 is a cross-section taken on the line VI—VI of the semiconductor device of FIG. 5.
Figure 7:
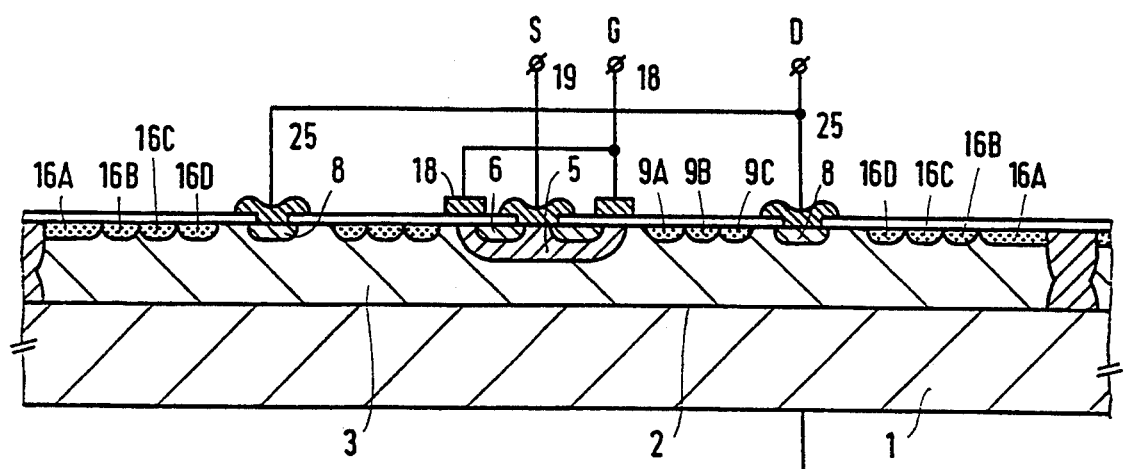
FIG. 7 is a cross-section of an embodiment of a semiconductor device according to the invention in which the breakdown voltage raising zones overlap.

The potentials of further breakdown voltage raising zones 9B, 9C are adjusted through charge transport from the first breakdown voltage raising zone 9A. The zones 9 have for this purpose an interspacing, at least locally, which is so small that charge transport between the zones 9 is possible, for example, by punch-through. FIGS. 5 and 6 show a further embodiment in which at least one of adjacent breakdown voltage raising zones 9 is provided with at least one portion 45 projecting towards the other zone, at the area of which portion the interspacing between this zone and the other zone is smaller than at an adjoining portion of this zone. Thus only two breakdown voltage raising zones 9A and 9B are present in FIG. 5. The zone 9B is provided with a projecting portion 45 which extends towards zone 9A. The degree of electrical coupling may be determined through a suitable choice of the shape of the projecting portion 45, in a manner similar to the possibilities for the first zone 9A relative to the back gate region. Thus the projecting portion 45 may be separated from the other zone by an intermediate portion of the surface region 3, corresponding to region 37 in FIG. 2B. The potential of zone 9B is then floating relative to that of 9A, while at a certain voltage difference between the zones 9A and 9B punch-through will take place at the projecting portions 45 and charge transport between 9A and 9B is possible. The projecting portion 45 may alternatively be in connection with the other zone (see FIG. 5). The width and length of the connections and the number of connections then determine the resistance between the zones. The use of projecting portions 45 affords a higher degree of design freedom. The zones 9A and 9B may be positioned at a comparatively large distance from one another, so that there is an additional degree of freedom for realizing a desired potential profile, or a desired electric field distribution. In a further embodiment shown in FIG. 7, adjacent breakdown voltage raising zones 9A, 9B and 9C overlap one another partly. Such an embodiment is readily manufactured in that doping profiles of doping atoms are made to overlap partly. The degree of overlap and the doping concentration then determine the electric resistance between the zones 9A, 9B, 9C. Thus at a distance of approximately 4 $\mu$m between the zones 9A, 9B and between 9B, 9C, for example, the zones 9A, 9B and 9C just much one another when the depth to which the zones 9A are diffused is also approximately 4 $\mu$m. The potentials of the zones are then determined by means of the resistance between the zones.

Preferably, the breakdown voltage raising zones 9 have such a high concentration of doping atoms that the zones 9 are not fully depleted when the surface region 3 is depleted over its entire thickness at least locally during the application of a voltage across the first pn junction 4. The projecting portions 35, 36, 45 are then sufficiently low-ohmic, so that a good electrical connection between the first zone 9A and the back gate region 5 can be realized, whereby the potential of the first zone is well defined, while in addition good electrical connections between further zones 9A, B and 9B, 9C may also be realized comparatively easily.

Figure 8:
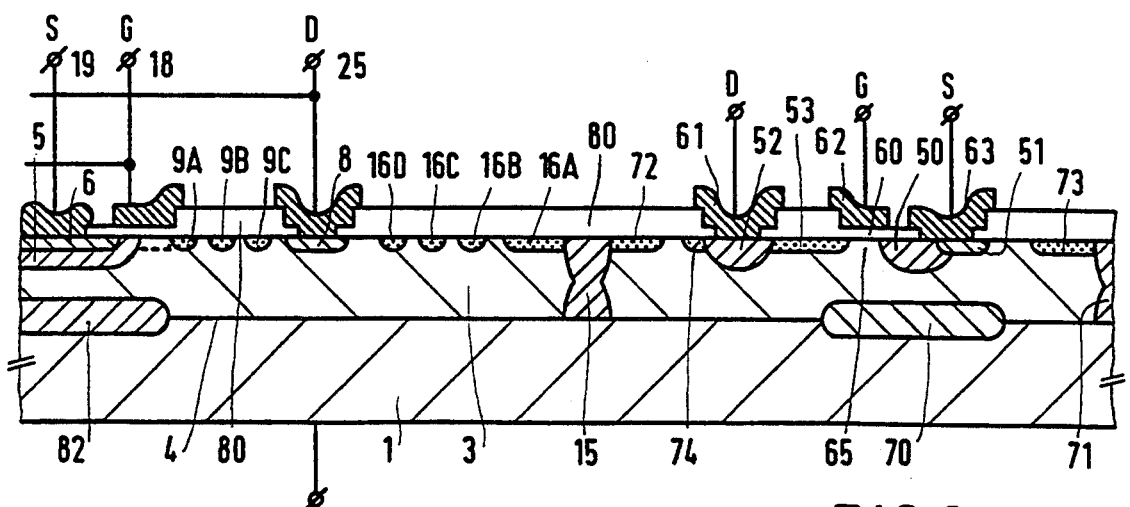
FIG. 8 is a cross-section of an embodiment of a semiconductor device according to the invention in which, in addition to an LDMOST, a-p-channel MOS transistor with an extended drain region (EPMOST) is present.

In practice, there is often a desire for different semiconductor switching elements, such as n- and p-channel elements, to be used in one semiconductor device. In addition to the n-channel LDMOST shown in FIGS. 1 to 7, accordingly, the semiconductor device also comprises, for example, an extended-drain p-channel MOST (EPMOST) (see FIG. 8) which is known per se. The EPMOST is formed in the epitaxial layer 3 and comprises a p-type source region 50, an n-type back gate region 65 with n-type contact region 51, a p-type drain region 52 with a p-type extension 53, metallizations 61 and 63 as drain and source connections, respectively, and a gate oxide 60 with gate electrode 62. The back gate region 65 acts as the channel region of the EPMOST. At the boundary between the semiconductor body 1 and the surface region 3 there is a comparatively highly doped n-type buried layer 70 below the source region 50 and the channel region 65. The EPMOST is laterally separated from other switching elements by comparatively highly doped p-type separation regions 15 and 71. P-type breakdown voltage raising surface zones 72, 73, 74 are connected to the separation regions 15, 71 and to the drain region 52. The doping of the source region 50 and of the drain region 52 of the EPMOST is the same as that of the back gate region 5 of the LDMOST. The back gate contact region 51 of the EPMOST has the same doping as the source region 6 and the drain region 8 of the LDMOST. The drain extension 53 must have a doping of approximately $2 \times 10^{12}$ atoms/cm$^2$ because of the electrical resistance of the extension region. It is very advantageous for a simple manufacture when the breakdown voltage raising zones 9, 16 and 74, the drain extension 53 and the extensions at the separation regions 72, 73 have the same doping atom concentrations, i.e. approximately $2 \times 10^{12}$ atoms/cm$^2$. All these regions may then be made in one and the same manufacturing step. The manufacturing process of the semiconductor device is then much simpler than if these zones were to have different doping concentrations.

Figure 9:
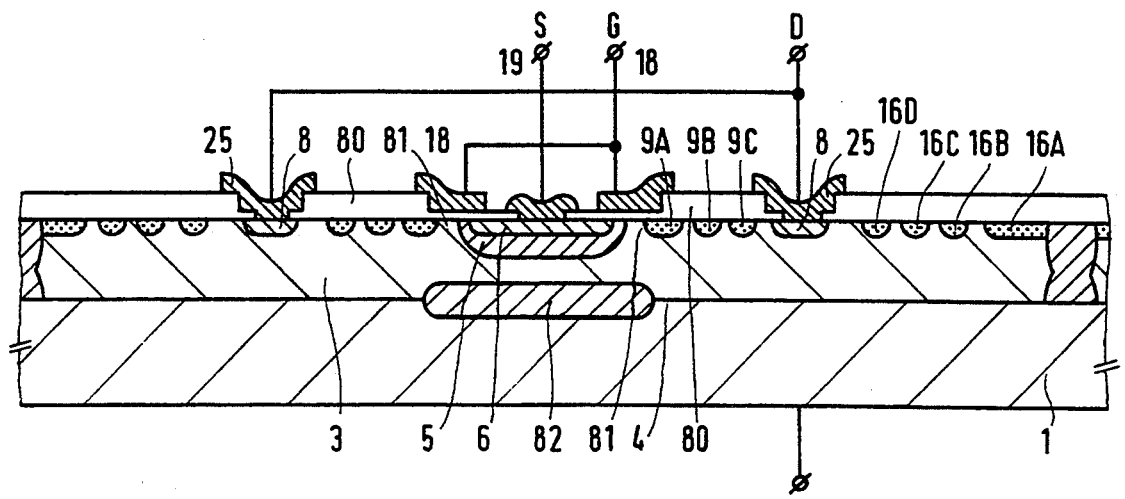
FIG. 9 is a cross-section of an embodiment of a semiconductor device according to the invention in which a dielectric layer with field plate is present on the surface and a further breakdown voltage raising zone is present below the back gate region.

The semiconductor is used in practice in high-voltage applications. The suitability of the semiconductor device comprising the LDMOST for high voltages may be further increased when a dielectric layer 80, which may have various thicknesses and which is at least partly covered by a conducting field plate 18 (see FIGS. 8, 9), is present on the surface 2 between back gate 5 and drain 8. Such a field plate is usually electrically connected to the gate electrode 18 or the source connection 19. In FIG. 9 the field plate is connected to the gate electrode 18 by way of example. The field plate 18 and the dielectric layer 80 may be used for depleting the surface region 3 from the surface 2, so that at higher doping levels of the surface region, for example more than $1 \times 10^{12}$ atoms/cm$^2$, nevertheless locally complete depletion of the surface region 3 can be achieved before breakdown occurs in this region. The dielectric layer 80 and the field plate 18 may be used for reinforcing the measures according to the invention. The field plate 18 in fact forms a gate electrode of a parasitic MOST in which the back gate region 5 and the first breakdown voltage raising zone 9A act as parasitic drain and source regions. The parasitic MOST may be used for improving the removal of holes from the first breakdown voltage raising zone 9A. This is possible because there is a conduction channel 81 between back gate 5 and first zone 9A when the parasitic MOST is on. The removal of charge carriers may take place through this channel, so that charge is removed not only via the projecting portions 35, 36, 45. To obtain a better stability of the LDMOST, the drain connection 25 also extends over the dielectric layer 80.

The LDMOST may be used in known manner in a so-called high-side application, i.e. the source and back gate regions are capable of carrying a high voltage relative to the semiconductor body, or in a low-side application, in which a high voltage may be applied to the drain region. In a low-side application, the operation of the breakdown voltage raising zones 9 at the surface 2 according to the invention may be further increased when the semiconductor device is provided with a further breakdown voltage raising zone 82 of the first conductivity type at a boundary between the surface region 3 and the semiconductor body 1 below the back gate region 5, with a doping atom concentration which is higher than that of the semiconductor body 1, for example, as shown in FIG. 9, a p-type buried layer 82 with a doping of $5 \times 10^{13}$ atoms/cm$^2$. The zone 82 by its higher doping level than that of the semiconductor body ensures that the surface region 3 is depleted more strongly than would be possible from the first pn junction 4 between the semiconductor body 1 and the surface region 3 alone. The surface region 3 is thus strongly depleted from two sides by the cooperation of the breakdown voltage raising zones 9 at the surface 2 and the breakdown voltage raising zone 82 from below the back gate 5, so that electric fields in the drift region 27 near the conduction channel 7 become less strong and breakdown of the surface region 3 will take place less quickly. In addition, holes are better drained off to the back gate region 5 and the substrate 1 in an n-channel LDMOST in the case of voltage changes at the drain region 8.

The invention is not limited to the embodiments described above. Thus, instead of a silicon semiconductor body, a body of a different semiconductor material may be used. The surface region 3 may be provided not only by epitaxial growth but also by diffusion or implantation. The conductivity types of the regions in the examples may also be the opposites. The projecting portions may differ from the regions to which they are attached as regards their doping levels, for example, for providing a high-ohmic or alternatively a low-ohmic connection between the breakdown voltage raising zones. It is also possible for the breakdown voltage raising zones 16 between the drain region 8 and the separation region 15 to be provided with projecting portions. The examples refer to a symmetrical construction in which a central back gate region 5 is substantially surrounded by a drain region 8, so that the channel region 7 is separated into two channel halves 7A and 7B. It is obviously also possible to use the invention in a different LDMOST construction, for example, with the drain region being surrounded by the back gate region, or when an asymmetrical construction is used.

I claim:

1. A semiconductor device of the RESURF type with a lateral DMOST (LDMOST), comprising a semiconductor body of substantially a first conductivity type and a surface zone which adjoins a surface, which is of a second conductivity type opposed to the first, and which forms a pn junction with the semiconductor body at the side remote from the surface, which LDMOST comprises a back gate region in the form of a surface zone of the first conductivity type provided in the surface region with a source region in the form of a surface zone of the second conductivity type in the back gate region and a channel region defined between the source region and an edge of the back gate region, and a drain region in the form of a surface zone of the second conductivity type which is at a distance from the back gate region, and a number of breakdown voltage raising zones of the first conductivity type provided so as to adjoin the surface between the back gate and the drain region, characterized in that at least one zone of the back gate region forming zone and of the first breakdown voltage raising zone, which lies closest to the back gate region, is locally provided with at least one portion projecting towards the other zone, at the area of which projecting portion the distance between this zone and the other zone is smaller than at an adjoining portion of this zone.

2. A semiconductor device as claimed in claim 1, characterized in that the projecting portion is separated from the other zone by an interposed portion of the surface region, the distance between the zones at the area of the projecting portion being so small that charge transport by means of punch-through is possible.

3. A semiconductor device as claimed in claim 2, characterized in that the distance at the area of the projecting portion is smaller than 5 μm.

4. A semiconductor device as claimed in claim 1, characterized in that the projecting portion is in connection with the other zone.

5. A semiconductor device as claimed in claim 1, having an elongate channel region with a width which is greater than the length of the channel region, characterized in that the projecting portion is situated near a narrow end of the channel region.

6. A semiconductor device as claimed in claim 1 having an elongate channel region with a width which is greater than the length of the channel region, characterized in that the projecting portion is situated at the area of a long side of the channel region and extends over a width which is small compared with the width of the channel of the LDMOST.

7. A semiconductor device as claimed in claim 6, characterized in that the projecting portion has a width which amounts to less than 10% of the channel width.

8. A semiconductor device as claimed in claim 6, characterized in that projecting portions are present at locations which are at least substantially homogeneously distributed over the width of the channel region.

9. A semiconductor device as claimed in claim 1, characterized in that at least one of adjacent breakdown voltage raising zones is provided with at least one portion which projects towards the other zone, at the area of which portion the distance between this zone and the other zone is smaller than at an adjoining portion of this zone.

10. A semiconductor device as claimed in claim 1, characterized in that adjacent breakdown voltage raising zones overlap one another partly.

11. A semiconductor device as claimed in claim 1, characterized in that the breakdown voltage raising zones have such a high concentration of doping atoms that the zones are not fully depleted when the surface region is depleted at least locally over its entire thickness upon the application of a voltage across the first pn junction.

12. A semiconductor device as claimed in claim 11, characterized in that the breakdown voltage raising zones have a concentration of doping atoms of more than $1.0 \times 10^{12}$ atoms/cm$^2$.

13. A semiconductor device as claimed in claim 1, characterized in that a dielectric layer, which is at least partly covered by a conducting field plate, is present on the surface between the back gate and the drain region.

14. A semiconductor device as claimed in claim 1, characterized in that a further breakdown voltage raising zone of the first conductivity type is provided below the back gate region at a boundary of the surface region and the semiconductor body, with a doping atom concentration which is higher than that of the semiconductor body.

* * * * *